United States Patent [19]

Vander Heyden

[11] 4,020,430

[45] Apr. 26, 1977

[54] FILTERED CONNECTOR ASSEMBLY WITH COMPOSITE GROUND PLANE

[75] Inventor: Eric Ernest Vander Heyden, Hummelstown, Pa.

[73] Assignee: AMP Incorporated, Harrisburg, Pa.

[22] Filed: Sept. 2, 1976

[21] Appl. No.: 720,162

Related U.S. Application Data

[63] Continuation of Ser. No. 572,540, April 28, 1975, abandoned.

[52] U.S. Cl. .................................... 333/79; 29/629; 333/70 S; 339/143 R; 339/147 R

[51] Int. Cl.² .................... H03H 7/14; H01R 15/16; H01R 15/14; H01R 17/10

[58] Field of Search ................. 333/79, 70 S, 73 C; 339/143 R, 147 R, 252 R, 252 P, 252 S; 317/242, 256, 257; 29/630 C, 629, 630 R, 630 G

[56] References Cited

UNITED STATES PATENTS

| | | | |
|---|---|---|---|
| 3,200,355 | 8/1965 | Dahlen | 333/79 |
| 3,588,758 | 6/1971 | Hurst | 333/79 |
| 3,617,958 | 11/1971 | Schor et al. | 333/79 |
| 3,743,978 | 7/1973 | Fritz | 333/79 |
| 3,743,979 | 7/1973 | Schor | 333/79 |
| 3,781,723 | 12/1973 | Harwood | 333/79 |
| 3,854,107 | 12/1974 | Tuchto et al. | 333/79 |

*Primary Examiner*—Alfred E. Smith
*Assistant Examiner*—Marvin Nussbaum
*Attorney, Agent, or Firm*—Gerald K. Kita

[57] ABSTRACT

A connector having a plurality of electrical contacts includes a metal plate to which is secured a foil sheet having spring properties. The sheet is punched to form apertures defined by circumferentially spaced tines. EMI filters are press fit within the apertures sandwiching the tines between the filters and the plate. The composite plate and foil provides a ground plane for the filters.

4 Claims, 4 Drawing Figures

FILTERED CONNECTOR ASSEMBLY WITH COMPOSITE GROUND PLANE

This is a continuation of application Ser. No. 572,540 filed Apr. 28, 1975 and now abandoned.

FIELD OF THE INVENTION

The present invention relates to an assembly of EMI filters within an electrical connector, and more specifically, to a connector and a technique for assembly thereof wherein EMI filters are press fit within a composite ground plane.

BACKGROUND OF THE PRIOR ART

There have been previous attempts in the prior art to provide a ground plane for EMI filters assembled within an electrical connector. One early assembly technique involved soldering each filter to the ground plane, a technique which was laborious, time consuming and adding to the weight and bulk of a connector. Another technique took a ground plane from a thin foil having resilient spring properties. The foil was provided with integral tines which radially gripped the EMI filters. Such a technique eliminated assembly time and the need to additional fastenting techniques for the filters. However ground faults were experienced due to uneven gripping pressure of the foil against corresponding filters. In addition the tines were easily damaged or permanently bent by insertion and retraction of the filters from the ground plane.

SUMMARY OF THE INVENTION

According to the present ivention an electrical connector is provided with a ground plane for EMI filters wherein the ground plane is of composite construction. That is the ground plane includes a rigid plate of conducting material provided with openings therethrough freely receiving corresponding electrical contacts mounted in and projecting through the connector. The ground plane further includes a sheet of foil having resilient spring properties. Apertures are defined in the foil by circumferentially spaced tines received in corresponding openings of the plate. EMI filters encircle and electrically engage corresponding projecting contacts and are press fit within the corresponding apertures defined by the tines. The tines are compressed and sandwiched between the received filters and the sidewalls of the openings in the bracket. The composite construction provides positive engagement with the filters preventing ground faults and provides anti-overstress stops for the tines preventing permanent deformation thereof.

OBJECTS

It is therefore an object of the present invention to provide an electrical connector with a ground plane into which EMI filters may be press fit. Another object of the present invention is to provide a composite ground plane for an electrical connector wherein resilient tines of a conducting foil cooperate with a rigid plate to permit press fit insertion of EMI filters within the tines while the plate prevents excessive deformation or bending of the tines.

Other objects and advantages of the present invention are apparent from the following detailed description and the drawings.

Figure 1:
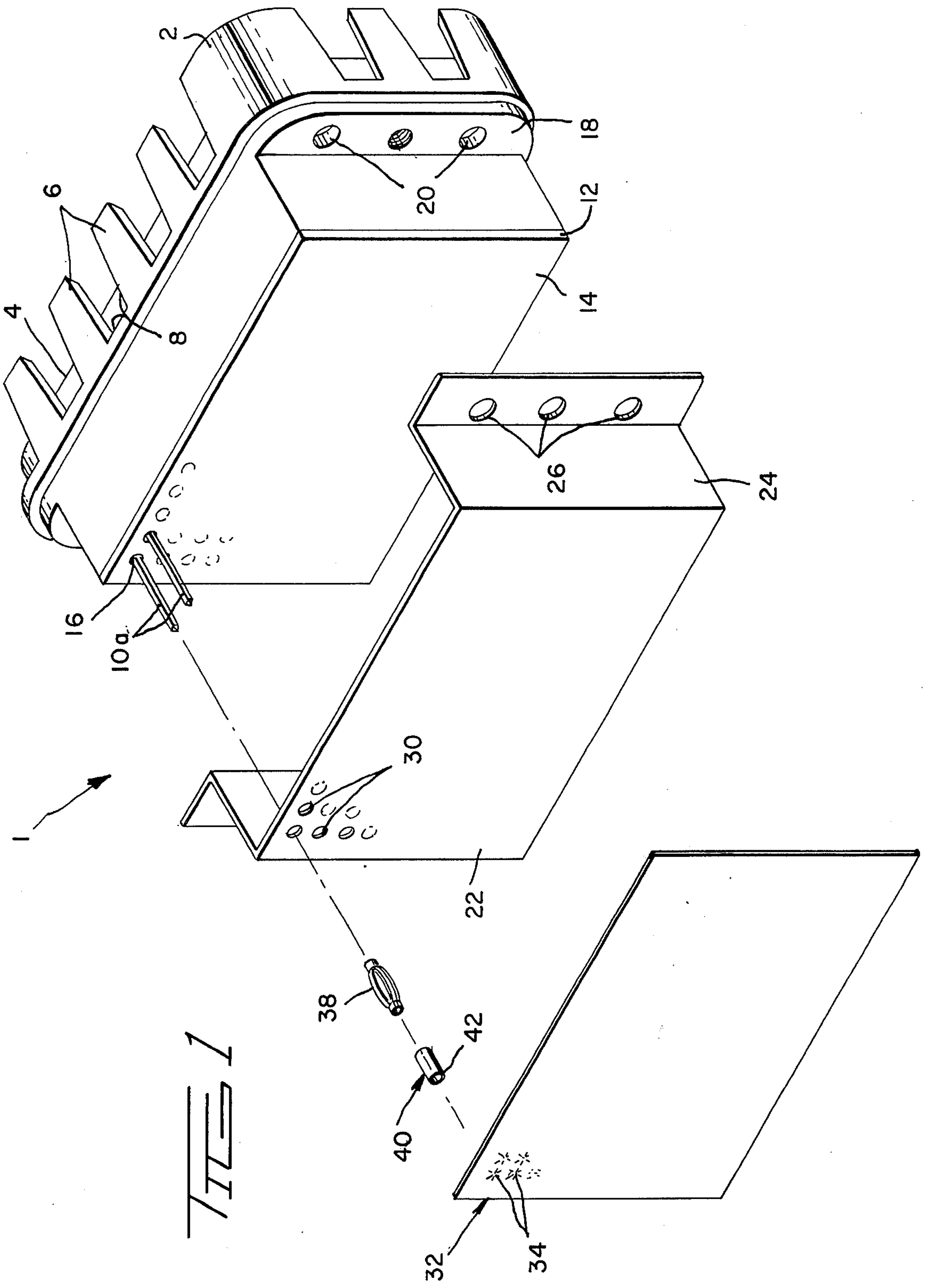
FIG. 1 is an enlarged perspective of a connector assembly according to the present invention with parts in exploded configuration to illustrate the details thereof.
Figure 2:
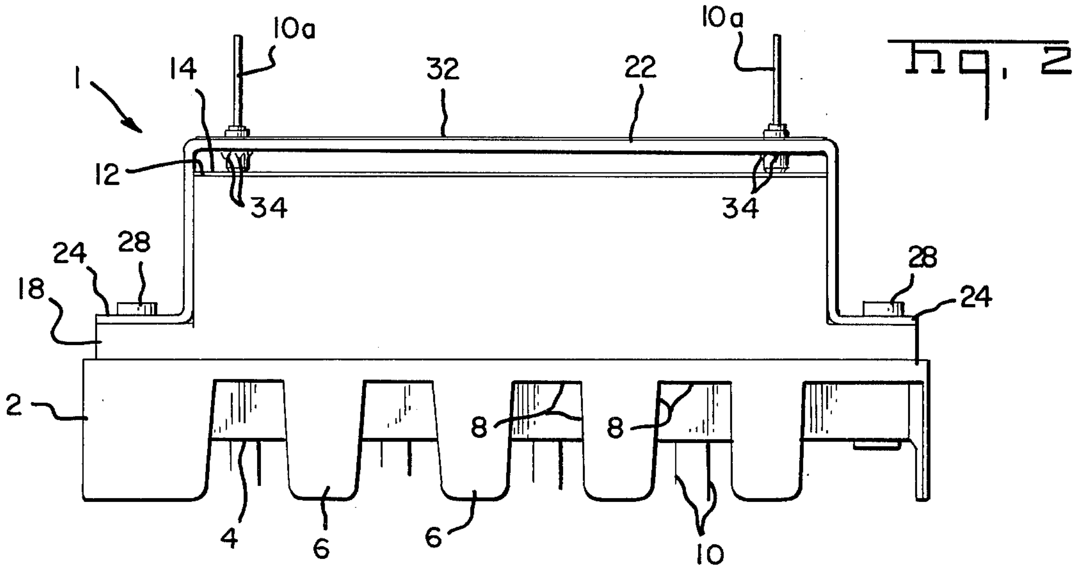
FIG. 2 is an enlarged elevation of a connector according to the present invention.
Figure 3:
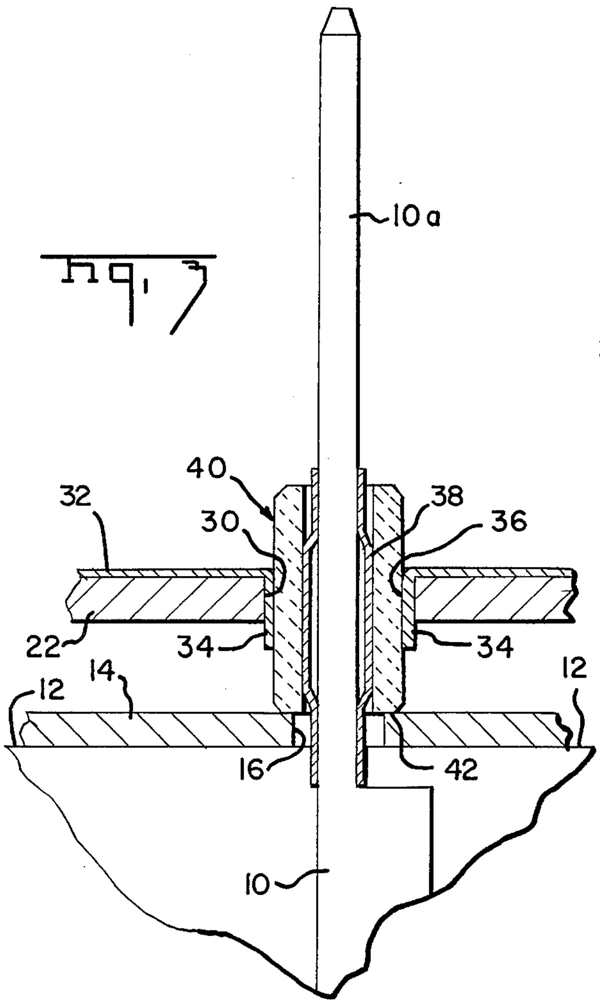
FIG. 3 is an enlarged section taken along the line 3—3 of FIG. 2.

With more particular reference to the drawings there is illustrated generally at 1 a connector portion according to the present invention wherein an outer shell 2 either of dielectric or metal has an end face 4 for connection to a mating connector portion. A plurality of tongues 6 alternating with a plurality of slots 8 polarize the connector portion 1 and matably engage corresponding tongue and slot portions on a mating connector portion which is not shown. The connector portion 1 is provided with a plurality of spaced contacts 10 of any desired elongated configuration which are mounted in and which project through the connector. More particularly the rearward portions 10*a* of the contact project outwardly from an end face 12 of the connector which is provided with an overlying dielectric spacer plate 14 having apertures 16 therethrough which freely receive therethrough the portions 10*a* of the contacts 10. The spacer plate is selected from any dielectric such as MUYLAR, G-10, PHENOLIC and for example is 0.020 inches in thickness. The shell is provided with a shoulder portion 18 provided with internally threaded recesses 20. A rigid metal plate 22 is provided with depending integral L-shaped flanges 24 having mounting apertures 26 therein corresponding in numbers and positions with the recesses 20. Threaded fasteners 28 are received in corresponding apertures 26 and are secured within corresponding recesses 20 to mount the plate 22 to the shell 2. The bracket may also be of simple plate construction mounted anywhere externally of or internally of the shell 2 as desired and according to any well known fastening techniques. It is important that the plate 22 be of conducting material having apertures 30 therein receiving corresponding portions 10a of the contacts 10 as shown in FIGS. 1 and 3. The plate is selected from any conductive material, for example, cold rolled steel 0.002 inches in thickness.

Figure 4:
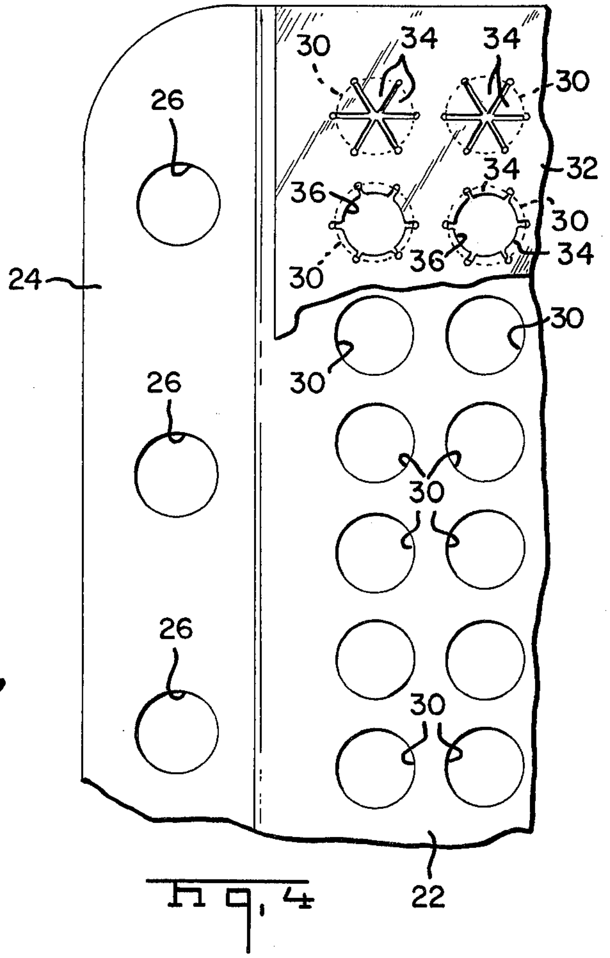
FIG. 4 is an enlarged plan view of prepunched ground plane according to the present invention.

A planar sheet 32 of a resilient foil material such as ASTM alloy 24, 0.003 inches in thickness is prepunched to form a plurality of tines 34 defining and circumferentially spaced around corresponding apertures 36 shown in FIG. 4. More particularly as shown in FIG. 4 the tines are formed coplanar with the sheet 32 and the sheet is assembled in position against the ground plane and secured thereto for example by conductive epoxy. The apertures 36 are formed by inserting a pointed tool and deforming the tines 34 outwardly of the plane of the sheet projecting the tines into corresponding apertures 30 of the plate 22. As shown in FIG. 3 the apertures 30 freely receive the projecting tines 34 therein with the tines in encirclement around corresponding contact portions 10a. Further in the assembly of the conntor, barrel shaped spring elements 38 are received over the contact portions 10a and freely within the confines of the encircling tines 34. Such spring elements are designed to be radially and resiliently compressible and may be of the type illustrated in U.S. Pat. No. 3,781.723. In addition barrel shaped or generally cylindrical EMI filters 40 of the type illustrated and described in U.S. Pat. No. 3,743,978 are received over corresponding spring elements 38 which electrically connect the filter bodies to the contact portions 10a. As shown the end portion 42 of the filters 40 are stopped against the dielectrict spacer 14 electrically isolating the same from the connector shell 2. The outer cylindrical peripheries of the filter bodies 40 are press fit within the apertures 36 defined by the encircling tines 34. More particularly the tines 34 are nonyieldingly compressed between the outer peripheries of the filter bodies and the sidewalls of the apertures 30 of the conducting plate 22. It is noticed in FIG. 3 that the tines 34 are longer than the thickness of the plate 22. That is the tips of the tines extend beyond the thickness of the plate 22 to insure resilient radially inward gripping on the filter bodies 40. The thickness of the plate however provides a positive stop resisting excessive bending or outward deflection of the tines particularly where they are integrally joined to the planar portion of the sheet 32. The ground plane for the filters accordingly is of composite construction involving resilient metal tines permitting press fit connection of the filters to the ground plane. Further the ground plane is in the form of a rigid plate which insures positive nonyielding compression of the tines in sandwiched position between the filters and the plate. The plate further provides a positive stop against excessive deflection to prevent breakage or permanent deformation of the tines 34. The tines 34 however project outwardly beyond the thickness of the plate allowing them to compress radially inward by their inherent resiliency into contact against the filter bodies.

Although a preferred embodiment of the present invention has been described and illustrated in detail other embodiments and modifications thereof which would be obvious to one having ordinary skill in the art are intended to be covered by the spirit and scope of the appended claims.

What is claimed is:

1. In a connector having a dielectric housing and at least one cavity in which is mounted a corresponding electrical contact provided thereover with an encircling filter body passing through an eletrically conducting foil sheet which is provided with a plurality of tines circumferentially encircling and electrically engaging a corresponding filter body, the improvement comprising:

a rigid metal plate connected to said housing and connected to said foil sheet to provide a composite ground plane, said plate having at least one opening through the thickness thereof receiving a corresponding electrical contact and a corresponding filter body, said tines being bent into receipt within said corresponding plate opening, said tines being compressed between and nonyieldingly engaging both the periphery of the corresponding filter body and the thickness of said plate defining the periphery of a corresponding plate opening, the thickness of said plate providing a positive stop against which said tines are nonyieldingly engaged to resist deflection thereof away from said filter body.

2. The structure as recited in Claim 1, wherein, said tines are greater in length that the thickness of said plate, and portions of said tines project not only into but also outwardly of said corresponding plate opening and resiliently grip a portion of a corresponding filter body periphery which is disposed outwardly of said plate thickness.

3. A method for assembling a composite ground plane connector, comprising the steps of:

providing an outer shell and a plurality of contacts mounted within said shell, securing a metal plate to said shell and to a foil sheet, punching radially arranged tines in said sheet, bending said tines outwardly of the plane of said sheet and into corresponding openings in said plate to provide apertures in said sheet in alignment with corresponding plate openings, encircling corresponding contracts with EMI filter bodies, press fitting bodies within corresponding apertures, and compressing and nonyieldingly engaging said tines against both said filter body peripheries and the thickness of said plate defining the peripheries of said corresponding plate openings.

4. The method as recited in claim 3, and further including the step of: projecting portions of said tines beyond the thickness of said plate and resiliently engaging said portions of said tines against said filter bodies.

* * * * *